US012697562B2

(12) United States Patent
Tripp et al.

(10) Patent No.: US 12,697,562 B2
(45) Date of Patent: Aug. 4, 2026

(54) SHOW EFFECT SYSTEM FOR AMUSEMENT PARK

(71) Applicant: Universal City Studios LLC, Universal City, CA (US)

(72) Inventors: Clayton James Tripp, Burbank, CA (US); Gregory Addison Hill, Jr., Santa Clarita, CA (US); Stephen Burnham Swift, Glendale, CA (US); Eli J. Romaire, Los Angeles, CA (US); Jonathan Harris Sangel, Los Angeles, CA (US); Alex Christopher Merryman, Pasadena, CA (US); Anthony Joseph Domingo, Reseda, CA (US); Jeffrey Gontar Small, Los Angeles, CA (US); Camille Ann Smolucha, North Hollywood, CA (US)

(73) Assignee: Universal City Studios LLC, Universal City, CA (US)

( * ) Notice: Subject to any disclaimer, the term of this patent is extended or adjusted under 35 U.S.C. 154(b) by 697 days.

(21) Appl. No.: 18/069,504

(22) Filed: Dec. 21, 2022

(65) Prior Publication Data

US 2024/0066425 A1 Feb. 29, 2024

Related U.S. Application Data

(60) Provisional application No. 63/401,944, filed on Aug. 29, 2022.

(51) Int. Cl.
| | |
|---|---|
| *A63J 5/02* | (2006.01) |
| *H05B 45/20* | (2020.01) |
| *H05K 7/20* | (2006.01) |

(52) U.S. Cl.
CPC ................ *A63J 5/02* (2013.01); *H05B 45/20* (2020.01); *H05K 7/20154* (2013.01); *H05K 7/20972* (2013.01)

(58) Field of Classification Search
None
See application file for complete search history.

(56) References Cited

U.S. PATENT DOCUMENTS

| | | |
|---|---|---|
| 3,780,357 A | 12/1973 | Haitz |
| 8,934,173 B2 | 1/2015 | Vasylyev |
| 9,719,655 B2 | 8/2017 | Krijn et al. |
| 10,274,160 B2 | 4/2019 | Parker et al. |

(Continued)

FOREIGN PATENT DOCUMENTS

| | | |
|---|---|---|
| EP | 2856015 A1 | 4/2015 |
| WO | 2013029630 A1 | 3/2013 |

OTHER PUBLICATIONS

RehabMart, "LED Multi-Sensory Light-Up Blanket," Jul. 18, 2019, pp. 1-17, https://www.rehabmart.com/product/led-multi-sensory-lightup-blanket-48204.html.

(Continued)

*Primary Examiner* — Omar S Parra
(74) *Attorney, Agent, or Firm* — Fletcher Yoder, P.C.

(57) ABSTRACT

A system for an entertainment venue includes an enclosure comprising a display surface, a light emitter disposed within the enclosure and configured to output a light, and a tube disposed within the enclosure. The tube is configured to receive the light and transmit the light through the display surface of the enclosure to form imagery.

20 Claims, 9 Drawing Sheets

(56)                 References Cited

U.S. PATENT DOCUMENTS

2007/0274089 A1    11/2007  Harris
2016/0320048 A1 *  11/2016  Daniels ..................... F21S 2/00

OTHER PUBLICATIONS

AttractionTickets.com, "Universal Reveal TapuTapu Secrets for
Volcano Bay," Jul. 2, 2017, pp. 1-8, https://www.attractiontickets.
com/en/latest-news/orlando/universal-orlando-tickets/universal-
reveal-taputapu-secrets-volcano-bay.
PCT/US2023/031303 International Search Report and Written Opin-
ion mailed Dec. 21, 2023.
AE Office Action for United Arab Emirates Application No. P2025-
00597 mailed Apr. 19, 2026.

* cited by examiner

SHOW EFFECT SYSTEM FOR AMUSEMENT PARK

CROSS-REFERENCE TO RELATED APPLICATION

This application claims priority to and the benefit of U.S. Provisional Application No. 63/401,944, entitled "SHOW EFFECT SYSTEM FOR AMUSEMENT PARK," filed Aug. 29, 2022, which is hereby incorporated by reference in its entirety for all purposes.

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Throughout amusement parks and other entertainment venues, special effects can be used to help immerse guests in the experience of a ride or attraction. Immersive environments may include three-dimensional (3D) props and set pieces, robotic or mechanical elements, and/or display surfaces that present media. In addition, the immersive environment may include audio effects, smoke effects, and/or motion effects. Thus, immersive environments may include a combination of dynamic and static elements. However, implementation and operation of special effects may be complex. For example, it may be difficult to provide innovative special effects. With the increasing sophistication and complexity of modern ride attractions, and the corresponding increase in expectations among theme or amusement park guests, improved and more creative attractions are desirable, including special effects that the guests may not expect and/or may not have previously experienced.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the subject matter. Indeed, the subject matter may encompass a variety of forms that may be similar to or different from the embodiments set forth below.

In an embodiment, a system for an entertainment venue includes an enclosure comprising a display surface, a light emitter disposed within the enclosure and configured to output a light, and a tube disposed within the enclosure. The tube is configured to receive the light and transmit the light through the display surface of the enclosure to form imagery.

In an embodiment, a show effect system for an amusement park includes a display surface, a plurality of light emitters configured to output light, and a plurality of tubes configured to receive the light output by the plurality of light emitters and to transmit the light onto a first side of the display surface and through the display surface to form imagery visible at a second side of the display surface.

In an embodiment, a light system for an amusement park show effect system includes a plate coupled to a light emitter configured to output light, a support configured to couple to a filter and to the plate to secure the filter and the light emitter to one another, and a shell coupled to a tube. The filter is configured to adjust a property of the light output by the light emitter to provide an adjusted light, the shell is configured to couple to the plate to secure the tube, the light emitter, and the filter to one another, and the tube is configured to receive the adjusted light and transmit the adjusted light for projection onto a display surface of the amusement park show effect system.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
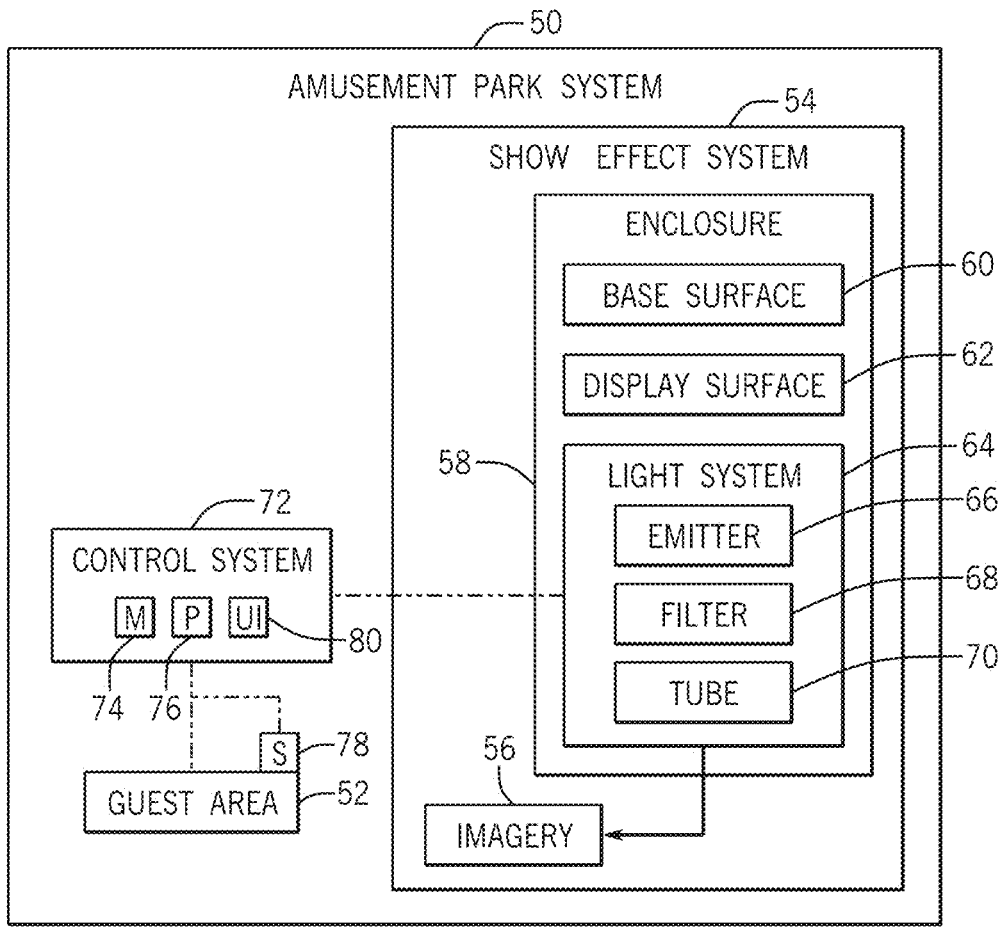
FIG. 1 is a schematic diagram of an embodiment of an amusement park system with a show effect system configured to present imagery, in accordance with an aspect of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure are directed to a system for use in an entertainment venue, such as an amusement park, and may be utilized in conjunction with various attraction systems. Present embodiments may include a show effect system configured to operate to present various special effects, such as visual effects and/or audio effects, to the guests. For example, the show effect system may be a part of an attraction system of the amusement park and may provide the special effects to guests within the attraction system, such as guests within a ride vehicle of the attraction system, at a queue of the attraction system, in an auditorium of the attraction system, and the like. Additionally, or alternatively, the show effect system may be external to any attraction system and may, for instance, present show effects to guests at a walking area, a dining area, a souvenir shop, and so forth. The special effects presented by the show effect system may entertain the guests.

It may be desirable to provide unexpected show effects to the guests in order to enhance the experience of the guests in the amusement park. For example, it may be desirable to present imagery via a prop that normally would not appear to be used for presenting imagery. As such, the present disclosure includes a show effect system that includes an enclosure with a surface that may not appear to have imagery presenting features. For instance, the surface may have an appearance and/or texture of a material, such as rock or concrete that the guests may not expect would present imagery. The show effect system may also include light emitters and tubes. The light emitters may output light into the tubes, and the tubes may receive the light from the light emitters and transmit the light through a length of the tubes. The tubes may be positioned adjacent to and/or embedded within an internal side of the surface of the enclosure. Thus, the tubes may project the light onto the enclosure. In an embodiment, the tubes may block dispersion of light from within the tubes to provide a concentrated projection of light that is transmitted through the enclosure. As such, the light may be viewable from an external side, opposite the internal side, of the enclosure. In this manner, the light output by the light emitters may form imagery that is visible to the guests from the external side of the enclosure. As an example, the effect produced by operation of the show effect system may provide an appearance to the guests that the enclosure is unexpectedly projecting the imagery.

In one embodiment, the show effect system may include a filter that adjusts an appearance of the light output by the light emitters and received by the tubes for transmission through the enclosure. As an example, the filter may adjust a color hue of the light. For instance, the filter may be selected or manufactured such that the light transmitted through the enclosure has an appearance that forms desirable imagery. In this manner, instead of implementing specific light emitters that output light having properties to form the desirable imagery, the filter may adjust any light output by the light emitters to form the desirable imagery. Thus, the filter may provide desirable light to form the imagery regardless of the light initially output by the light emitters. Indeed, it may be easier and/or more cost efficient to adjust the filter as compared to adjusting the light emitters to present particular imagery via the show effect system. Thus, implementation of the filter may reduce a complexity and/or cost associated with manufacture and/or operation of the show effect system.

With the preceding in mind, FIG. 1 is a schematic diagram of an embodiment of an amusement park system 50, which may be representative of any venue that would benefit from entertainment (e.g., a theatre, a restaurant, a waiting room). As an example, the amusement park system 50 may be a part of an attraction system, such as a ride (e.g., a roller coaster, a dark ride), a performance show, and the like. As another example, the amusement park system 50 may be a part of a dining venue, a waiting area, a walkway, a shopping venue (e.g., a gift shop), or any other suitable part of an amusement park. The amusement park system 50 may therefore include a guest area 52 where guests may be located. For instance, the guest area 52 may include a ride vehicle, a pathway (e.g., a queue), seating, or any other suitable feature that accommodates guests within the amusement park system 50.

The amusement park system 50 may also include a show effect system 54 configured to provide certain effects to the guests of the guest area 52. For example, operation of the show effect system 54 may present imagery 56 that becomes visible to the guests at certain times. The imagery 56 may be presented via a surface that may not be expected as being used for displaying imagery. For instance, the imagery 56 may be displayed through what appears to be a geological formation, such as a rock or mineral, a building material, a seemingly opaque material, and the like. To present such imagery 56, the show effect system 54 may include an enclosure 58. The enclosure 58 may include a base surface 60 and a display surface 62 that are visible to the guests. The base surface 60 may be made of a material that is not typically used for displaying imagery. For example, the material of the base surface 60 may be selected based on the surrounding environment (e.g., themed props) of the show effect system 54 so that the enclosure 58 may appear to be inconspicuously arranged as a part of the surrounding environment. The display surface 62 may have a texture that blends the display surface 62 in with the base surface 60. That is, the display surface 62 and the base surface 60 may appear seamlessly integrated with one another when viewed by the guests. However, the imagery 56 may be presented through the display surface 62 to enable the guests to view the imagery 56.

For example, a light system 64 may be coupled to the display surface 62. The light system 64 may focus lighting through the display surface 62 in order to present the imagery 56 through the display surface 62, which may be at least partially translucent and/or transparent to enable light transmittance through the display surface 62. For instance, the display surface 62 may be composed of a cured material, such as a liquid plastic or resin material that solidifies upon curing. However, the display surface 62 may block visibility of components of the light system 64. The base surface 60 may be composed of a different material that may be opaquer than the material of the display surface 62 to block unwanted light transmission through the base surface 60. As an example, the base surface 60 may be composed of concrete. The base surface 60 and the display surface 62 may be coupled to one another, such as via a fastener, an adhesive, or any other suitable feature, and blended to provide an essentially seamless optical transition between the base surface 60 and the display surface 62. In an embodiment, the base surface 60 and the display surface 62 may be blended via paint, a surface finish, or any other suitable technique that enables the base surface 60 and the display surface 62 to appear as a single, integral surface instead of separate, individual surfaces.

The light system 64 may include a light emitter 66 (e.g., a light emitting diode, a light bulb) configured to output a light. The light system 64 may also include a filter 68 through which the light output by light emitter 66 may be transmitted. The filter 68 may be configured to adjust the color of the light transmitted through the filter 68. By way of example, the filter 68 may include a gobo slide, an optical filter, or any other suitable component that may adjust a property of light, such as a hue, an intensity, a saturation, a tint, a shade, a brightness, a tone, a tint, another suitable property, or any combination thereof. The filter 68 may adjust an appearance of the light initially transmitted by the light emitter 66 to have a desirable appearance when viewed through the display surface 62 as a part of the imagery 56. For example, instead of utilizing a specific embodiment of the light emitter 66 that may directly output a desirable light through the display surface 62 to provide the imagery 56, a particular embodiment of the filter 68 may be selected to adjust the light output by the light emitter 66 to provide the desirable light that provides the imagery 56. Indeed, different embodiments of the filter 68 may be more easily implemented and/or less expensive to manufacture and/or purchase as compared to different embodiments of the light emitter 66 that may output different light. Thus, utilization of the filter 68 may provide greater customizability and/or flexibility at reduced costs to adjust the imagery 56 being presented as compared to implementation of different light emitters 66.

The light system 64 may further include a tube 70 (e.g., a pixel tube) that may receive the light output by the light emitter 66 through the filter 68. The tube 70 may focus the light for transmission through the display surface 62. In other words, the tube 70 may reduce dispersion of the light to concentrate projection of the light onto the display surface 62, thereby increasing transmissivity of the projected light through the display surface 62. Thus, the tube 70 may facilitate visibility of the light, and therefore of the imagery 56 formed by the light, through the display surface 62. The filter 68 may be positioned between the light emitter 66 and the tube 70 such that the tube 70 receives the light adjusted by filter 68. Thus, the light emitter 66 may be positioned external to the tube 70.

A control system 72 (e.g., an automation controller, a programmable controller, an electronic controller) that is a part of or communicatively coupled to the show effect system 54 may be configured to control the light system 64 to adjust the imagery 56 being presented. The control system 72 may include a memory 74 and processing circuitry 76. The memory 74 may include volatile memory, such as random access memory (RAM), and/or non-volatile memory, such as read-only memory (ROM), optical drives, hard disc drives, solid-state drives, or any other non-transitory computer-readable medium that includes instructions to operate the light system 64. The processing circuitry 76 may be configured to execute such instructions. For example, the processing circuitry 76 may include one or more application specific integrated circuits (ASICs), one or more field programmable gate arrays (FPGAs), one or more general purpose processors, or any combination thereof.

For example, the control system 72 may be configured to operate the light emitter 66 to output light or to block output of light. Adjusting the output of light via the light emitter 66 may enable or block presentation of the imagery 56 and/or adjust an appearance of the imagery 56. In an embodiment, the control system 72 may operate the light system 64 based on data received from a sensor 78. For instance, the sensor 78 may determine a parameter associated with the guest area 52. As an example, the parameter may include a quantity of guests in the guest area 52. The control system 72 may receive the data indicative of the quantity of guests and operate the light emitter 66 to output light in response to determining the quantity of guests exceeds a threshold quantity. As another example, the parameter may include a position of a guest, such as relative to the enclosure 58. The control system 72 may receive the data indicative of the position of the guest and operate the light emitter 66 to output light in response to determining the position of the guest is within a threshold distance of the enclosure 58. As a further example, the sensor 78 may include a reader configured to receive an input or a signal transmitted by a device (e.g., a mobile device, a wristband, a headset) of the guest, and receipt of the input may cause the sensor 78 to transmit data signal to the control system 72 to cause the control system 72 to operate the light emitter 66. The control system 72 may further operate the light emitter 66 based on any other suitable parameter, such as a time of day, a time of operation of the show effect system 54, a level of ambient light surrounding the show effect system 54, and the like. Operation of the control system 72 based on the sensor 78 may enable the control system 72 to operate automatically (e.g., without receipt of a user input).

The control system 72 may further include a user interface (UI) 80 with which a user, such as an operator of the show effect system 54 and/or a guest of the guest area 52, may interact. The control system 72 may operate the light system 64 based on the interaction with the UI 80. For example, the interaction with the UI 80 may indicate a request to adjust presentation of the imagery 56, and the control system 72 may operate the light emitter 66 accordingly. Thus, the UI 80 may enable more customizable operation of the control system 72 to operate the show effect system 54.

Figure 2:
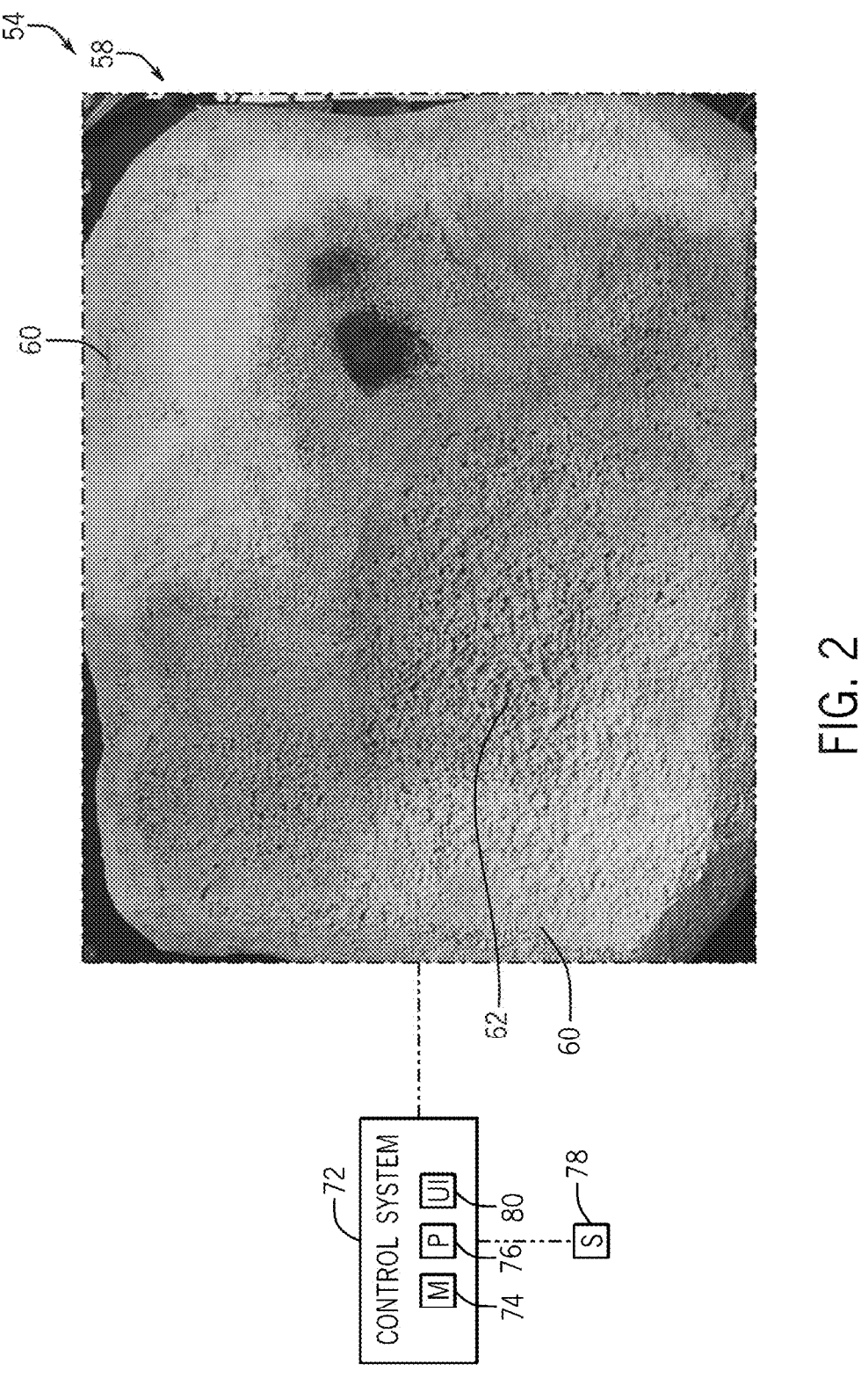
FIG. 2 is a front view of an embodiment of a show effect system configured to present imagery, in accordance with an aspect of the present disclosure.

FIG. 2 is a front view of an embodiment of the show effect system 54. In the illustrated show effect system 54, the enclosure 58 includes a rock-like appearance and texture causing it to present as a stone. To this end, each of the base surface 60 and the display surface 62 may have rock-like appearances, and the base surface 60 and the display surface 62 may blend in with one another (e.g., when the display surface 62 is not backlit). For example, the base surface 60 may surround the display surface 62. The enclosure 58 may also conceal certain components of the show effect system 54, such as the light system. In this manner, the light system may not be visible to the guests, and imagery may be more unexpectedly presented via the show effect system 54 as a result.

The control system 72 operates the show effect system 54 (e.g., the light system) to block presentation of any imagery in the illustrated embodiment. Thus, the illustrated show effect system 54 may be in a non-display state in which imagery is not presented. As an example, the control system 72 may operate the show effect system 54 in the non-display state based on absence of data (e.g., received from the sensor 78) that indicates imagery is to be presented by the show effect system 54. In response, the control system 72 may block emission of light (e.g., via any of the light emitters of the light system) to block presentation of the imagery.

Figure 3:
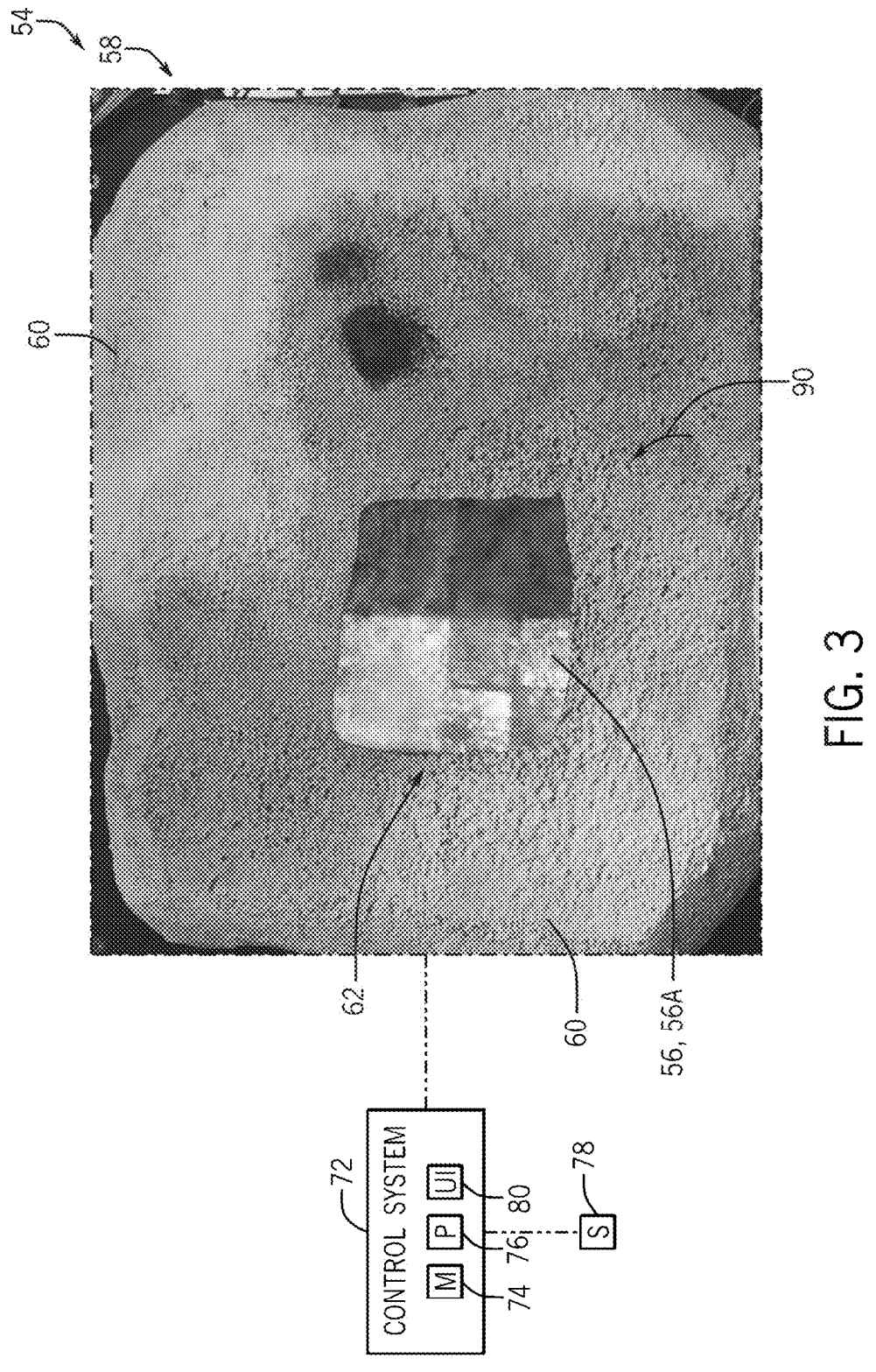
FIG. 3 is a front view of an embodiment of a show effect system in operation to present imagery, in accordance with an aspect of the present disclosure.

FIG. 3 is a front view of the embodiment of the show effect system 54 of FIG. 2 in an active state. Specifically, the control system 72 operates the show effect system 54 in a display state in which first imagery 56A is presented via the show effect system 54. For example, the control system 72 may operate the light system by causing a first set of light emitters to output light, and the light may be transmitted through the display surface 62 (e.g., via light-transmitting tubes). The light transmitted through the display surface 62 may form the first imagery 56A at an external (e.g., visible) side 90 of the display surface 62. In this manner, the enclosure 58 may project the first imagery 56A at the display surface 62, which may give the impression that the first imagery 56A is being displayed via a stone.

As an example, the control system 72 may operate the show effect system 54 in the illustrated display state in response to a prompt to present the first imagery 56A. For instance, data received from the sensor 78 may indicate that a guest is within a threshold distance of the show effect system 54 (e.g., of the enclosure 58) and/or an interaction with the UI 80 may provide the prompt to present the first imagery 56A. As discussed above, because the light system or other components configured to facilitate presentation of the first imagery 56A may be concealed via the enclosure 58, presentation of the first imagery 56A may be unexpected to the guests. For example, a guest may not expect a stone, a board, a brick, or the like to present imagery. In this manner, the show effect system 54 may present the first imagery 56A in a more effective or memorable way to the guests and improve the experience provided to the guests.

Figure 4:
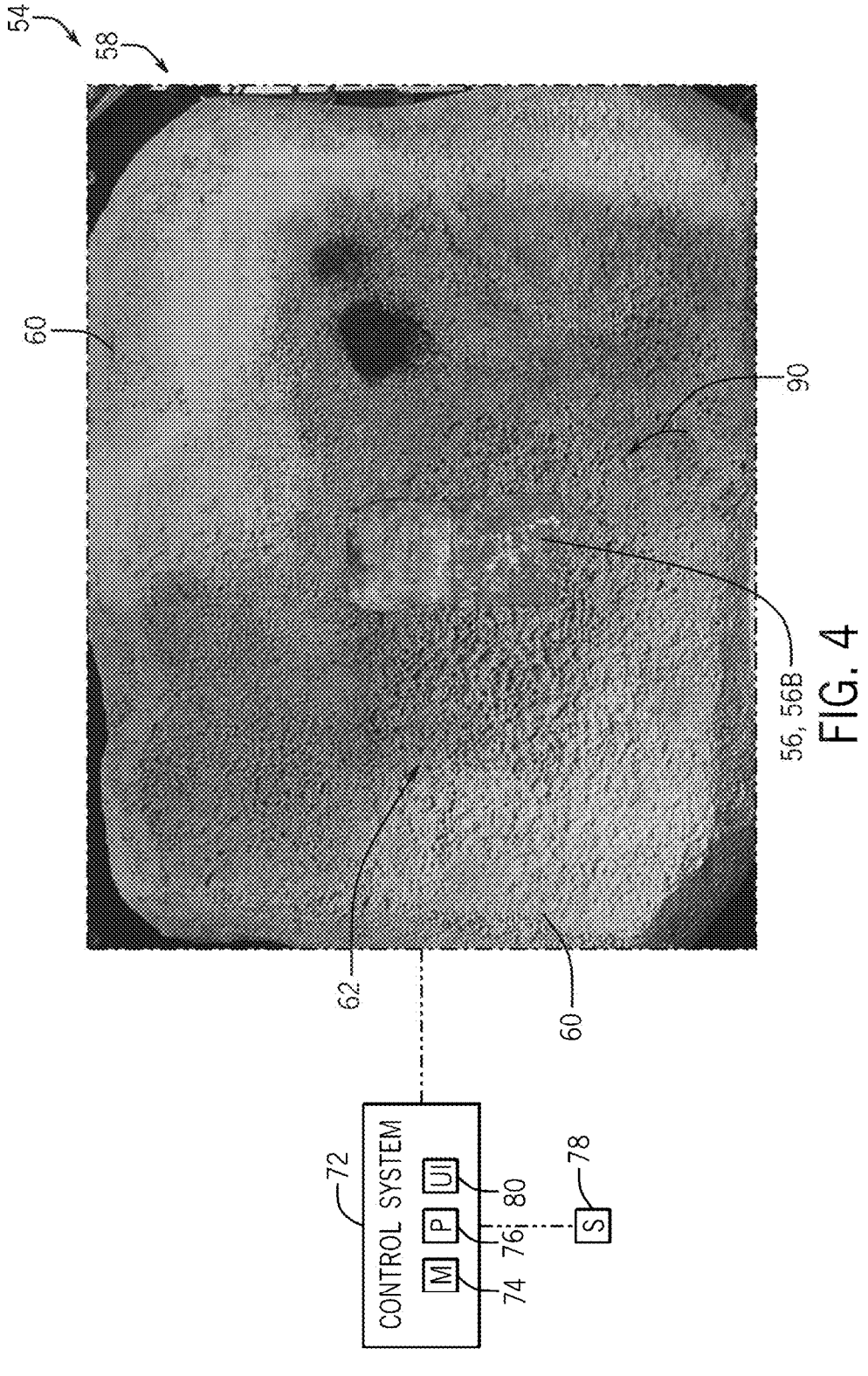
FIG. 4 is a front view of an embodiment of a show effect system in operation to present imagery, in accordance with an aspect of the present disclosure.

FIG. 4 is a front view of an embodiment of the show effect system 54 of FIGS. 2 and 3. In the illustrated embodiment, the control system 72 operates the show effect system 54 in a display state in which second imagery 56B, different from the first imagery 56A of FIG. 3, is presented via the show effect system 54 at the external side 90 of the display surface 62. For instance, the control system 72 may operate the light system by causing a second set of light emitters to output light to form the second imagery 56B. By way of example, the second set of light emitters in operation to form the second imagery 56B may be different (e.g., include fewer light emitters) than the first set of light emitters in operation to form the first imagery 56A of FIG. 3. Indeed, the control system 72 may independently operate the light emitters to control individual operation of each light emitter to output light or to block output of light in order to form different imagery presented by the show effect system 54. For instance, the control system 72 may adjust the imagery 56 being presented to provide an animation or appearance of movement of the imagery 56. In an embodiment, the control system 72 may also control each light emitter to adjust a particular property of light being emitted, such as an intensity of light output by each light emitter. Thus, the control system 72 may operate the show effect system 54 to adjust the appearance of presented imagery more acutely. As an example, the control system 72 may adjust operation of the second set of light emitters to display the second imagery 56B in different manners, such as at different brightness levels.

In an embodiment, the control system 72 may operate the show effect system 54 to adjust the imagery being presented based on data received from the sensor 78. For instance, the control system 72 may selectively operate the light emitters to cause different imagery to be presented based on a particular distance between a guest and the show effect system 54, a quantity of detected guests, a time of day, or any other suitable parameter (e.g., as indicated by data received from the sensor 78). In an additional or alternative embodiment, the control system 72 may operate the show effect system 54 to adjust the imagery being presented based on a user interaction with the UI 80. Operation of the control system 72 to cause different imagery to be presented via the show effect system 54 may provide a more personalized show effect, provide greater variation of show effects, and so forth, further improving the experience provided to the guests.

Figure 5:
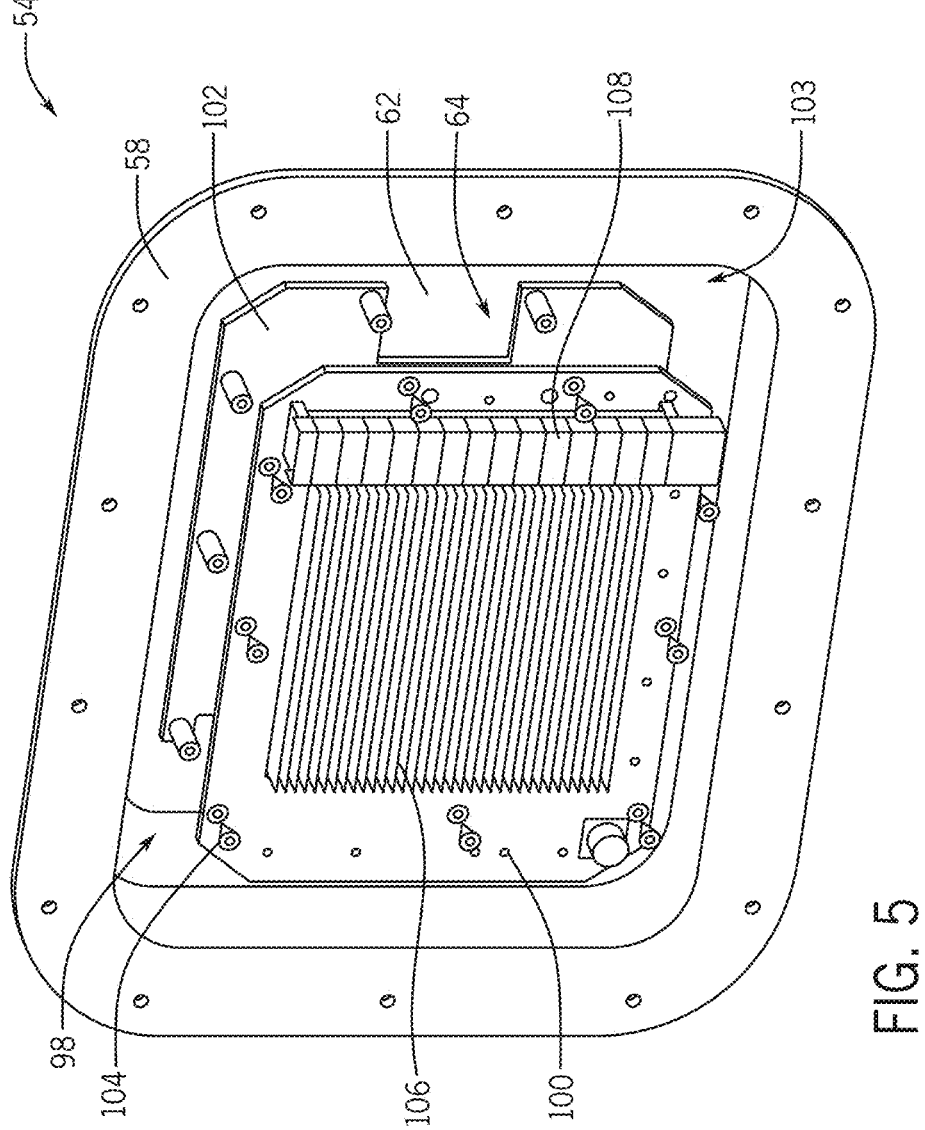
FIG. 5 is a rear perspective view of an embodiment of a show effect system having a light system and an enclosure, in accordance with an aspect of the present disclosure.

FIG. 5 is a perspective rear view of the show effect system 54 having the light system 64 in engagement with the enclosure 58. For example, the light system 64 may at least partially extend within a channel 98 (e.g., a compartment, a cavity) defined by the enclosure 58. The light emitters (not shown) may be secured to a plate 100 of the light system 64. The plate 100 may be coupled to a shell 102 of the light system 64, such as via fasteners 104 or any other suitable feature (e.g., a weld, an adhesive, a punch), to secure the light emitters and the shell 102 to one another. The tubes (not shown) may be secured to the shell 102 such that securement of the plate 100 and the shell 102 to one another may position the light emitters and the tubes adjacent to one another. As such, the light output by the light emitters may be directed through the tubes. Additionally, the tubes may be coupled to or embedded in an internal (e.g., concealed, hidden) side 103 of the display surface 62 to enable the light output by the light emitters and directed through the tubes to be transmitted through the display surface 62 to form the imagery visible to the guests.

In an embodiment, the plate 100 may include a heat sink 106 (e.g., fins) configured to dissipate heat, such as heat produced during operation of the show effect system 54. For example, the light emitters may produce heat during operation to output light, and the heat may be directed to the heat sink 106 and rejected to an ambient environment via convection and/or radiation. To this end, the light emitters may be in contact with the heat sink 106 to enable heat transfer from the light emitters to the heat sink 106. Dissipation of heat via the heat sink 106 may reduce a temperature of the light emitters, which may improve a structural integrity and/or increase a useful lifespan of the light emitters. The plate 100 may also include a fan 108 (e.g., a tangential fan) configured to operate to direct an air flow. For instance, the fan 108 may direct the air flow across the light emitters and/or the heat sink 106 to increase heat dissipation and further reduce the temperature of the light emitters. Thus, each of the heat sink 106 and the fan 108 may improve operation of the show effect system 54.

The plate 100, shell 102, fasteners 104, heat sink 106, fan 108, and/or any other suitable component of the light system 64 may not be visible through the enclosure 58. For example, guests that see the show effect system 54 may not be able to view the light system 64 through the display surface of the enclosure 58. Thus, upon seeing light transmitted by the light system 64 through the enclosure 58 via the display surface, the guests may be more surprised by the appearance of the imagery formed by the show effect system 54.

Figure 6:
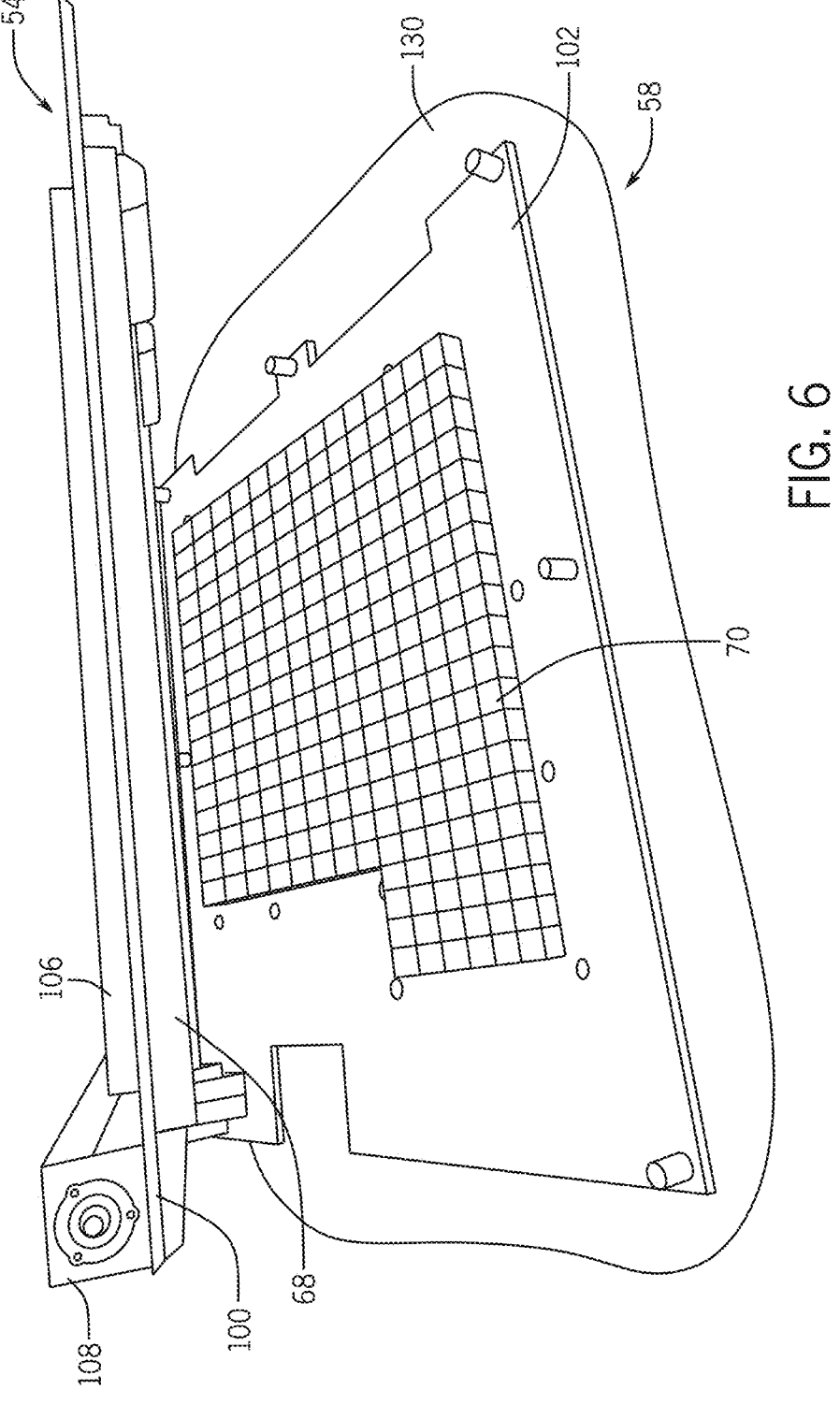
FIG. 6 is a side perspective view of an embodiment of a show effect system configured to present imagery, in accordance with an aspect of the present disclosure.

FIG. 6 is a side perspective view of an embodiment of the show effect system 54. The shell 102 may be engaged with the enclosure 58, such as to flanges 130 of the enclosure 58, to secure the shell 102 and the enclosure 58 to one another and engage the tubes 70 with the enclosure 58 (e.g., to insert the tubes 70 within the channel of the enclosure 58, to embed the tubes 70 within the display surface). Additionally, the filter 68 may be coupled to the plate 100 to enable the light emitters (not shown) that are secured to the plate 100 to output light through the filter 68. In the assembled configuration in which the plate 100 and the shell 102 are coupled to one another, the filter 68 may be in engagement with the tubes 70. As such, the tubes 70 may receive the light output by the light emitters and transmitted through and adjusted by the filter 68. The tubes 70 may transmit the received light through the enclosure 58 (e.g., through the display surface) to form imagery visible to the guests. As described above, the filter 68 may adjust the light transmitted through the filter 68 to provide a desirable appearance of the light transmitted through the tubes 70 to form target imagery.

Figure 7:
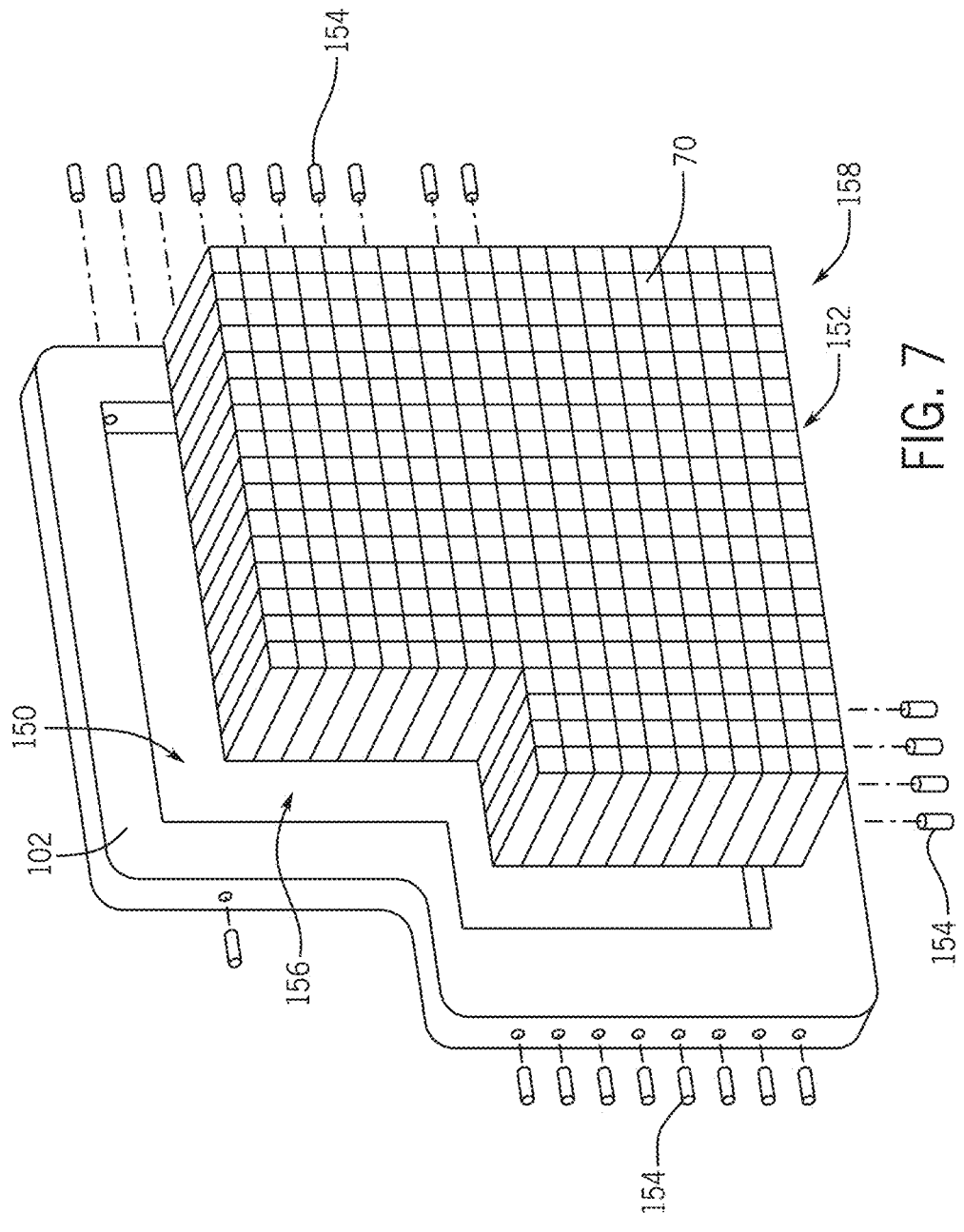
FIG. 7 is a front perspective view of an embodiment of tubes of a show effect system, the tubes being configured to transmit light to facilitate presentation of imagery, in accordance with an aspect of the present disclosure.

FIG. 7 is a front perspective view of an embodiment of the tubes 70 and the shell 102. The shell 102 may define a space 150 in which the tubes 70 may be inserted. As an example, the tubes 70 may be secured to one another to form a tube array 152, and the tube array 152 may be inserted within the space 150 to collectively position the tubes 70 within the space 150. Fasteners 154 (e.g., set screws) may be inserted through the shell 102, into the space 150, and against the tubes 70 to secure the tubes 70 within the space 150, thereby securing the tubes 70 and the shell 102 to one another. For example, the fasteners 154 may impart a compressive force against the tubes 70 to provide a frictional force that blocks relative movement between the array of tubes 152 and the shell 102.

Each tube 70 may include a silvered, frosted, or any other suitably treated exterior to block dispersion of light from an interior of the tube 70. In this way, the silvered exterior of the tube 70 may enable better light transmission through the tube 70 and improve concentrated projection of light onto the display surface to form desirable imagery. Additionally, or alternatively, each tube 70 may be composed of a material, such as acrylic and/or plastic, that avoids absorption of light to enable greater light transmission therethrough. A first end 156 of the tube 70 may be positioned adjacent to the filter and the light emitters in the installed configuration of the show effect system. Thus, the light output by the light emitters and adjusted by the filter may be directed into the tube 70 at the first end 156. The light may be transmitted through the tube 70 and projected out of the tube 70 via a second end 158 of the tube 70. The second end 158 of the tube 70 may be positioned adjacent to and/or in engagement with (e.g., embedded in) the display surface to enable the light to be transmitted through the display surface. For instance, each tube 70 may enable light to be projected onto a concentrated area of the display surface. By way of example the light projected by each tube 70 may form respective portions (e.g., respective pixels) of the imagery presented via the display surface.

There may be any suitable quantity of tubes 70 in the array of tubes 152 to enable transmission of light through the display surface to form desirable imagery. In an embodiment, the quantity of tubes 70 may match the quantity of light emitters, and each tube 70 may align with and correspond to one of the light emitters. In an alternative embodiment, there may be a different quantity of tubes 70 as compared to the quantity of light emitters. As an example, there may be a greater quantity of tubes 70 than light emitters, and a subset of the implemented tubes 70 may be utilized during operation of the light emitters to output light to present imagery. A greater quantity of tubes 70 increases the resolution and/or detail associated with the imagery presented by the show effect system. As another example, there may be a fewer quantity of tubes 70 than light emitters (e.g., one of the tubes 70 may receive light from multiple light emitters). Additionally, although the illustrated tubes 70 have a rectangular cross-sectional geometry, in an additional or alternative embodiment, the tubes 70 may have any suitable cross-sectional geometry, such as a circular, triangular, and/or irregular cross-sectional geometry. Moreover, the tubes 70 may have any suitable size (e.g., cross-sectional area, length from the first end 156 to the second end 158).

Indeed, the array of tubes 152 may include tubes 70 having a variety of cross-sectional geometries and sizes.

Figure 8:
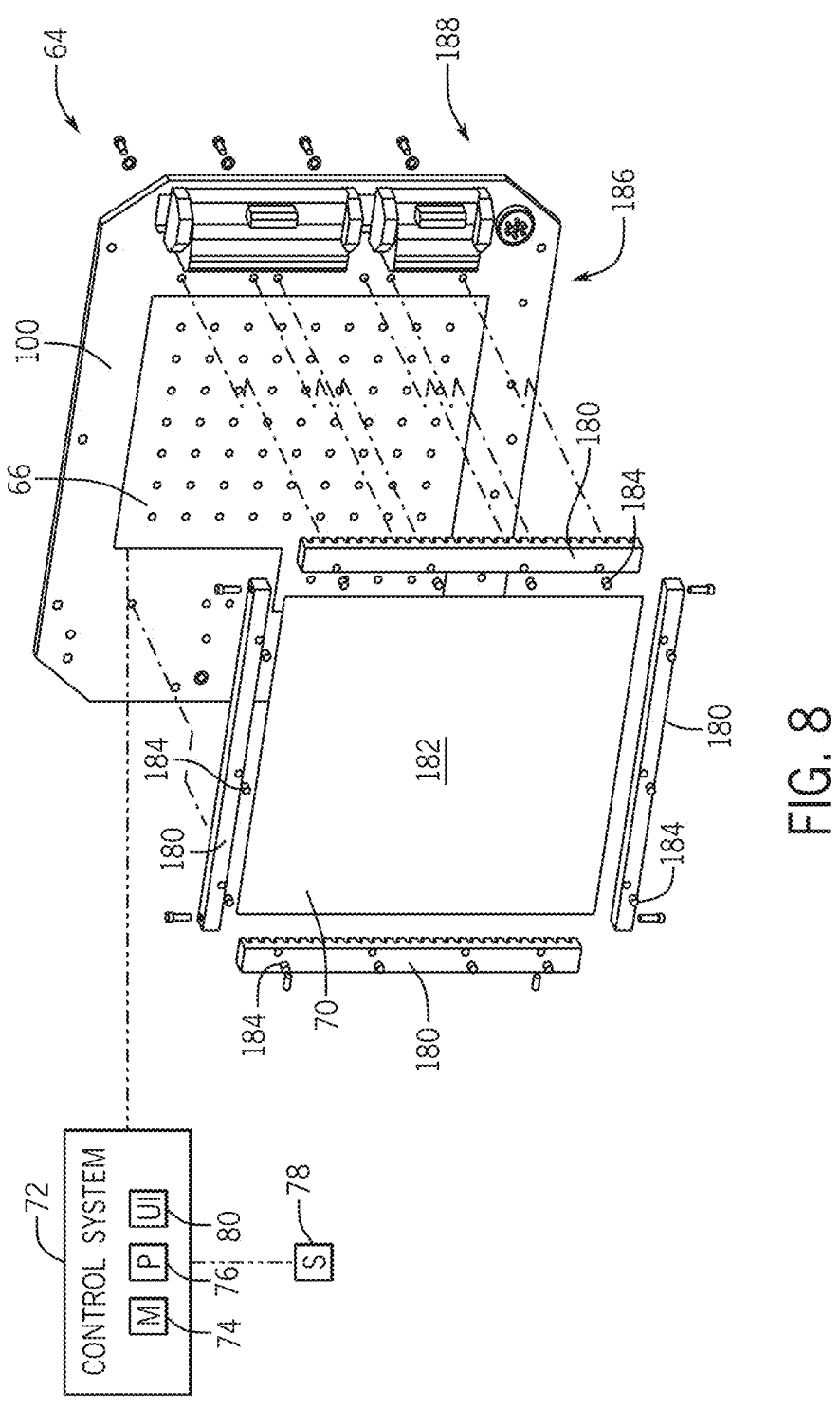
FIG. 8 is a front exploded view of an embodiment of a show effect system configured to present imagery, in accordance with an aspect of the present disclosure.

FIG. 8 is a front exploded view of an embodiment of the light system 64 illustrating the coupling between the light emitters 66 and the filter 68. Supports 180 may be used to couple the filter 68 to the plate 100 and to place the filter 68 adjacent to the light emitters 66. For example, the supports 180 may include individual pieces or parts that capture a perimeter of the filter 68, thereby avoiding affecting light transmitted (e.g., via the light emitters 66) through a medial surface 182 of the filter 68. The supports 180 may also be configured to couple to the plate 100, such as via fasteners 184 that are separate from the fasteners used to couple the plate 100 and the shell having the tubes. Thus, the plate 100 and the shell may be decoupled from one another without decoupling the plate 100 and the supports 180 from one another. For example, the light emitters 66 and the filter 68 may be removed from the show effect system (e.g., for maintenance) without affecting implementation of the tubes and/or the enclosure. In an embodiment, the supports 180 may position the filter 68 at an offset distance from the light emitters 66, such as 1.25 centimeters (cm) (e.g., 0.5 inches), 2.5 cm (e.g., 1 inch), 5 cm (e.g., 2 inches), or any suitable distance away from the light emitters 66. Positioning the supports 180 at the offset distance from the light emitters may reduce heat transfer from the light emitters 66 to the filter 68 and block a temperature increase of the filter 68, thereby maintaining a structural integrity of the filter 68.

As discussed above, the filter 68 may adjust the light output by the light emitters 66 to provide a light with desirable properties to be transmitted through the tubes to form the imagery. By way of example, different portions of the filter 68 may have different properties (e.g., absorb different colors, permit transmission of different colors) to provide a desirable pattern or arrangement of light directed through the tubes and projected onto the display surface. For instance, operation of a first subset of light emitters 66 to output light through a first portion of the filter 68 may cause presentation of first imagery (e.g., the first imagery 56A of FIG. 3), and operation of a second subset of light emitters 66 to output light through a second portion of the filter 68 may cause presentation of second imagery (e.g., the second imagery 56B of FIG. 4). In this manner, the filter 68 may enable different imagery to be provided based on the light emitters 68 that are in operation to output light through the filter 68 and through the display surface.

For instance, the filter 68 may adjust the light output by the light emitters 66 such that the light projected onto and transmitted through the display surface form the imagery having desirable light (e.g., color) properties. Indeed, in an embodiment, the display surface may also adjust a property (e.g., color) of the light transmitted therethrough. For example, the material of the display surface may cause adjustment of the light, such as by providing the light with a blueish hue. For this reason, the filter 68 may be selected to account for the adjustment of light caused by the display surface to present the desirable imagery. For example, a filter may be used to offset inherent filtering occurring through the display surface and to achieve a desire result. Thus, light that is output by the light emitters, initially adjusted by the filter 68, and then transmitted through and adjusted by the enclosure may provide desirable imagery visible to the guests.

As discussed above, the filter 68 may be utilized to adjust the imagery (e.g., change a color of the light that forms the imagery) presented to the guest instead of, for example, adjusting the light emitters 66 (e.g., individually colored light emitters). Indeed, it may be easier to change the filter 68 as compared to changing the light emitters 66. For example, to change the filter 68, the plate 100 may be decoupled from the shell to enable access to the filter 68 and the supports 180, and the supports 180 may be decoupled from the plate 100 and/or from one another to enable removal of the filter 68. A new filter 68 may then be coupled to the supports 180, the supports 180 may be coupled to one another and to the plate 100 to secure the new filter 68 to the plate 100, and the plate 100 may be coupled to the shell to assemble the light system 64 and establish the show effect system in the assembled configuration. In an additional or alternative embodiment, instead of implementation of a single filter 68, multiple filters may be used to adjust the light output by the light emitters 66. For example, each individual filter may be configured to receive light output by a subset of the light emitters 66, and the filters may cooperatively adjust the light output by the light emitters 66 to enable presentation of desirable imagery.

The light emitters 66 may be attached to the plate 100, such as at a first side 186 of the plate 100 opposite a second side 188 of the plate 100 where the heat sink may be attached. As an example, the light emitters 66 may be secured to the plate 100 via a fastener, an adhesive, a weld, a punch, an interference fit, or any other suitable feature. A quantity of light emitters 66 may be selected for implementation based on a desirable appearance of the imagery to be presented. For example, a greater quantity of light emitters 66 (e.g., and corresponding tubes configured to receive light output by the light emitters 66) may be utilized to present an imagery having a higher resolution and/or detail. Additionally, the light emitters 66 may be arranged in any suitable manner, such as to form a particular shape that would enable presentation of a desirable imagery. In any case, each light emitter 66 may be communicatively coupled to the control system 72 to enable the control system 72 to operate the light emitters 66 independently from one another. For instance, the control system 72 may selectively cause a first subset of the light emitters 66 to output light and block a second subset of the light emitters 66 from outputting light.

Although the embodiments described above include the filter 68 configured to adjust the light output by the light emitters 66 to enable the show effect system to present imagery, in an additional or alternative embodiment, another technique may be utilized to present imagery having a desirable appearance. For example, in one embodiment, the light emitters 66 (e.g., liquid crystal displays) may be configured to adjust properties of light being output. Thus, the control system 72 may directly operate the light emitters 66 to output light having desirable properties without usage of the filter 68 to adjust the light projected onto and transmitted through the display surface to form desirable imagery.

Figure 9:
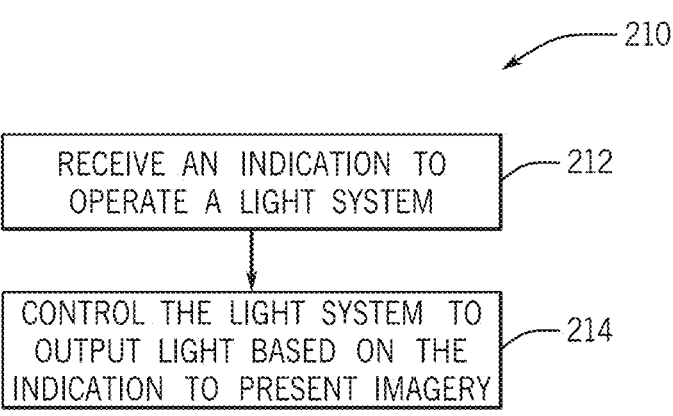
FIG. 9 is a flowchart of an embodiment of a method or process for operating a show effect system to present imagery, in accordance with an aspect of the present disclosure.

FIG. 9 is a flowchart of an embodiment of a method or process 210 for operating any of the show effect systems 54 described herein. The method 210 may be performed by a single component or system, such as by the control system 72 (e.g., the processing circuitry 76). In an additional or alternative embodiment, multiple components or systems may perform the operations of the method 210. It should also be noted that additional operations may be performed with respect to the described method 210. Furthermore, certain operations of the depicted method 210 may be modified.

At block 212, an indication to operate a light system may be received. As an example, the indication may include data indicative of a parameter. For instance, the parameter may include a position of a guest relative to a component of the show effect system, a quantity of guests, a time of operation, a time of day, another suitable parameter, or any combination thereof. The parameter may be received from a sensor. In an embodiment, indication may include a signal received from a reader. The reader may be configured to transmit the signal in response to receiving an input from a device, such as a device of a guest. As another example, the indication may include a user input received via a user interaction, such as with a UI of the show effect system.

At block 214, the light system may be operated to output light based on the indication to present imagery. For example, in response to receiving the indication, light emitters of the light system may be operated to output light, and the light may be transmitted through a display surface via tubes that concentrate transmission of the light. Thus, the light transmitted through the display surface may be visible to form the imagery. For example, the enclosure may appear to be unexpectedly projecting the imagery. In one embodiment, each light emitter may be independently controllable. Thus, each light emitter may be selectively operated to present the imagery. For example, a first subset of light emitters may be operated in response to receiving a first indication to present first imagery. A second subset of light emitters may be operated in response to receiving a second indication to present second imagery. Indeed, different light emitters may be operated to present different imagery based on a particularly received indication. As an example, different light emitters may be operated to provide an appearance of animated or moving imagery and/or to provide varying show effects to different guests.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for (perform)ing (a function) . . . " or "step for (perform)ing (a function) . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system for an entertainment venue, the system comprising:

an enclosure comprising a display surface;

a light emitter disposed within the enclosure, wherein the light emitter is configured to output a light;

a tube disposed within the enclosure, wherein the tube is configured to receive the light and transmit the light through the display surface of the enclosure to form imagery; and a filter retained by supports between the light emitter and the tube, wherein the filter is selectively removable from the supports and the filter is configured to adjust a property of the light output by the light emitter prior to the light being received by the tube.

2. The system of claim 1, wherein the property of the light comprises a color hue.

3. The system of claim 1, wherein the tube is embedded in the display surface.

4. The system of claim 1, wherein the tube comprises a silvered exterior to block dispersion of light through the tube and to facilitate transmission of the light from the light emitter to the display surface.

5. The system of claim 1, wherein the light emitter is disposed external to the tube and the supports position the filter at an offset distance from the light emitter.

6. The system of claim 1, comprising a control system, wherein the control system is configured to selectively operate the light emitter to output the light.

7. The system of claim 1, wherein the enclosure comprises a base surface coupled to the display surface, the base surface and the display surface are blended in with one another to form the enclosure, and the base surface is composed of a material that blocks transmission of the light therethrough.

8. The system of claim 1, wherein the filter is offset from the light emitter by the support.

9. A show effect system for an amusement park, the show effect system comprising:

a display surface;

a plurality of light emitters, wherein each light emitter of the plurality of light emitters is configured to output light;

a plurality of tubes configured to receive the light output by the plurality of light emitters and to transmit the light onto a first side of the display surface and through the display surface to form imagery visible at a second side of the display surface; and one or more filters positioned between the plurality of light emitters and the plurality of tubes, wherein the one or more filters are selectively coupled via at least one support between the plurality of tubes and the plurality of light emitters, and wherein the one or more filters are configured to adjust a property of the light output by the plurality of light emitters before the light is received by the plurality of tubes.

10. The show effect system of claim 9, comprising a shell coupled to the plurality of tubes and a plate coupled to the plurality of light emitters, wherein the shell and the plate are configured to couple to one another to secure the plurality of tubes and the plurality of light emitters to one another.

11. The show effect system of claim 10, comprising the at least one support coupled to the one or more filters, wherein the support is configured to couple to the plate to secure the one or more filters, to the plurality of light emitters.

12. The show effect system of claim 9, comprising a control system configured to operate the plurality of light emitters independently of one another to adjust the imagery formed via the light output by the plurality of light emitters and transmitted onto the first side of the display surface.

13. The show effect system of claim 12, comprising a reader communicatively coupled to the control system, wherein the reader is configured to receive an input from a device of a guest of the amusement park, the reader is configured to transmit a signal to the control system in response to receiving the input from the device, and the control system is configured to operate the plurality of light emitters to output the light in response to receiving the signal from the reader.

14. A light system for an amusement park show effect system, the light system comprising:

a plate coupled to a light emitter configured to output light;

a support configured to couple to a filter, wherein the support is configured to couple to the plate to secure the filter and the light emitter to one another, and the filter is configured to adjust a property of the light output by the light emitter to provide an adjusted light; and a shell coupled to a tube, wherein the shell is configured to couple to the plate to secure the tube, the light emitter, and the filter to one another, and the tube is configured to receive the adjusted light and transmit the adjusted light for projection onto a display surface of the amusement park show effect system.

15. The light system of claim 14, wherein the support is configured to offset the light emitter and the filter from one another.

16. The light system of claim 14, wherein the plate comprises a heat sink configured to dissipate heat produced by the light emitter.

17. The light system of claim 16, comprising a fan coupled to the plate, wherein the fan is configured to direct an air flow across the heat sink.

18. The light system of claim 14, wherein the shell defines a space, the tube is disposed within the space, the light system comprises a fastener inserted through the shell and into the space, and the fastener imparts a force onto the tube to secure the tube within the space.

19. The light system of claim 14, comprising a first fastener configured to couple the support and the plate to one another and comprising a second fastener configured to couple the plate and the shell to one another.

20. The system of claim 14, wherein the support is a plurality of supports that are coupled to two or more sides of the filter, and wherein the plurality of supports is configured to facilitate removably coupling of the filter to the plate.

\* \* \* \* \*